(12) United States Patent
Keszler et al.

(10) Patent No.: US 9,340,678 B2
(45) Date of Patent: May 17, 2016

(54) PROCESS TO FORM AQUEOUS PRECURSOR AND ALUMINUM OXIDE FILM

(75) Inventors: Douglas A. Keszler, Corvallis, OR (US); Wei Wang, Corvallis, OR (US)

(73) Assignee: State of Oregon acting by and through the State Board of Higher Education on behalf of Oregon State University, Corvallis, OR (US)

( * ) Notice: Subject to any disclaimer, the term of this patent is extended or adjusted under 35 U.S.C. 154(b) by 593 days.

(21) Appl. No.: 13/703,592

(22) PCT Filed: Jun. 14, 2011

(86) PCT No.: PCT/US2011/040307
§ 371 (c)(1),
(2), (4) Date: Dec. 11, 2012

(87) PCT Pub. No.: WO2011/159675
PCT Pub. Date: Dec. 22, 2011

(65) Prior Publication Data
US 2013/0084672 A1    Apr. 4, 2013

Related U.S. Application Data

(60) Provisional application No. 61/354,560, filed on Jun. 14, 2010.

(51) Int. Cl.
*B05D 5/12* (2006.01)
*C09D 1/00* (2006.01)
(Continued)

(52) U.S. Cl.
CPC .............. *C09D 1/00* (2013.01); *C23C 18/1216* (2013.01); *C23C 18/1245* (2013.01); *C23C 18/1283* (2013.01); *H01L 31/02168* (2013.01); *H01L 31/18* (2013.01); *H01L 31/1868* (2013.01); *Y02E 10/50* (2013.01); *Y02P 70/521* (2015.11)

(58) Field of Classification Search
USPC .......................................................... 427/74
See application file for complete search history.

(56) References Cited

U.S. PATENT DOCUMENTS 3,927,184 A  * 12/1975 Hodgson ....................... 423/394
4,246,040 A     1/1981 Okumura et al.
(Continued)

OTHER PUBLICATIONS

Gatlin et al. "Facile synthesis of the tridecameric Al13 nanocluster AL13(μ3—OH)6(4—OH)18(H2O)24(NO3)15" (Jan. 17, 2008).*
(Continued)

*Primary Examiner* — Austin Murata
(74) *Attorney, Agent, or Firm* — Klarquist Sparkman, LLP

(57) ABSTRACT

One disclosed embodiment concerns an aqueous inorganic coating precursor solution comprising a mixture of water, polynuclear aluminum hydroxide cations, and polyatomic ligands selected from nitrate ($NO_3^-$), nitrite ($NO_2^-$), or combinations thereof. In certain embodiments, the composition has a molar concentration ratio of polyatomic ligands to aluminum of less than 3; an aluminum cation concentration of from about 0.01 M to about 3.5 M; and/or a polyatomic anion concentration of from about 0.1 to about 2.5 times the aluminum cation concentration. Embodiments of a method for forming the precursor solution also are disclosed. For example, certain embodiments comprise adding a metal having a sufficient reduction potential to reduce nitric acid to an aqueous solution comprising aluminum nitrate ($Al(NO_3)_3$).

21 Claims, 13 Drawing Sheets

(51) Int. Cl.
*H01L 31/0216* (2014.01)
*H01L 31/18* (2006.01)
*C23C 18/12* (2006.01)

(56) References Cited

U.S. PATENT DOCUMENTS

| | | | |
|---|---|---|---|
| 6,027,706 A * | 2/2000 | Pinnavaia et al. | 423/600 |
| 6,522,794 B1 | 2/2003 | Bischel et al. | |
| 2005/0022863 A1 | 2/2005 | Agostinelli et al. | |
| 2007/0169805 A1 | 7/2007 | Sasaki et al. | |
| 2008/0312067 A1 | 12/2008 | Lortz et al. | |
| 2010/0032012 A1 | 2/2010 | Isaka et al. | |
| 2010/0044698 A1 | 2/2010 | Herman et al. | |

OTHER PUBLICATIONS

International Search Report dated Oct. 27, 2011, from International Application No. PCT/US2011/040307.

\* cited by examiner (b) Simulation

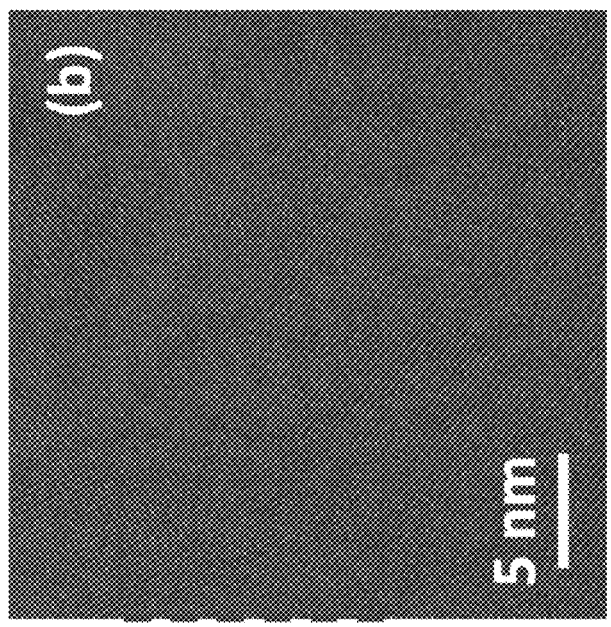
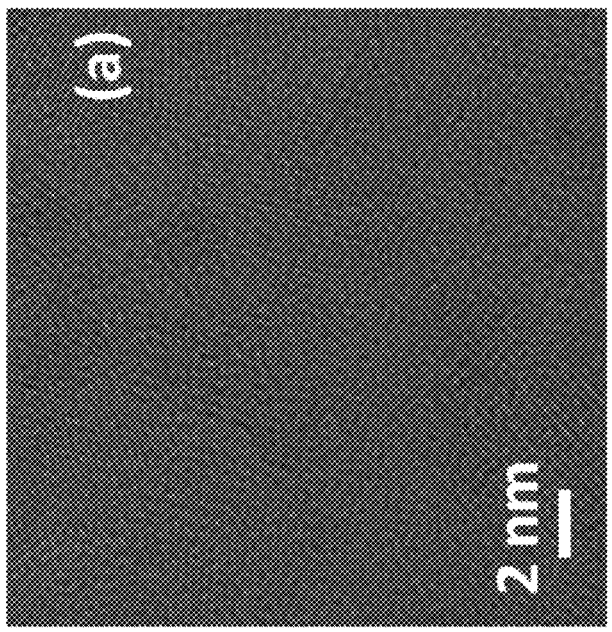
FIG. 8A  FIG. 8B  FIG. 8C

PROCESS TO FORM AQUEOUS PRECURSOR AND ALUMINUM OXIDE FILM

CROSS REFERENCE TO RELATED APPLICATION

This is the U.S. National Stage of International Application No. PCT/US2011/040307, filed Jun. 14, 2011, which in turn claims the benefit of the earlier filing date of U.S. provisional application No. 61/354,560, filed on Jun. 14, 2010, which is incorporated herein by reference.

ACKNOWLEDGMENT OF GOVERNMENT SUPPORT

This invention was made with government support from the United States Air Force under agreement number FA8650-05-1-5041. The government has certain rights in the invention.

FIELD

Disclosed embodiments concern improved solution-based approaches for the synthesis of aluminum oxide precursors. The invention further relates to formation of thin films of aluminum oxide.

BACKGROUND

Aluminum oxide has many desirable properties for the formation of functional elements. For example, it is technologically important as a barrier coating, optical film, and as a thin-film component of electronic devices. The quality of the material can be significant with respect to the ability to produce desired commercial products. At the same time, commercial pressures to produce goods at lower costs create separate challenges.

SUMMARY

In a first aspect, the invention pertains to a precursor solution comprising an aqueous solvent having dissolved aluminum and nitrate with a nitrate:aluminum ratio<3.

In a further aspect, the invention pertains to a method for preparing an aqueous solution containing aluminum and nitrate, comprising forming a solution with aluminum nitrate and Zn and then selectively removing the Zn.

In another aspect, the invention pertains to a method for the formation of an aluminum oxide film. In some embodiments, the method comprises annealing a precursor layer at a temperature from about 50° C. to about 900° C. in which the precursor layer comprises aluminum and nitrate with a nitrate:aluminum ratio<3.

One disclosed embodiment concerns an aqueous inorganic coating precursor solution comprising a mixture of water, polynuclear aluminum hydroxide cations, and polyatomic ligands selected from nitrate ($NO_3^-$), nitrite ($NO_2^-$), or combinations thereof. In certain embodiments, the composition has a molar concentration ratio of polyatomic ligands to aluminum of less than 3; an aluminum cation concentration of from about 0.01 M to about 3.5 M; and/or a polyatomic anion concentration of from about 0.1 to about 2.5 times the aluminum cation concentration.

Embodiments of a method for forming an aqueous inorganic coating precursor solution also are disclosed. For example, certain embodiments comprise adding a metal having a sufficient reduction potential to reduce nitric acid in an aqueous solution comprising aluminum nitrate ($Al(NO_3)_3$). The molar concentration of Al ranges from about 0.01 to about 3.5 M and the Zn:Al ratio ranges from about 0.01:1 to about 3:1. The metal typically is selected from zinc, aluminum, iron, copper, or combinations thereof. The method may further comprise precipitating an aluminum salt, such as by evaporating sufficient water to cause the aluminum salt to precipitate. The aluminum salt may be isolated and washed with a solvent sufficiently polar to selectively remove Zn-containing reaction products, such as by washing with an alcohol solvent, an ester solvent, or combinations thereof. The alcohol or ester solvent generally has ten or fewer carbon atoms, with examples of suitable solvents including methanol, ethanol, propanol, isopropanol, ethyl ethanoate, methyl ethanoate, ethyl propanoate, and methyl propanoate. Combinations of solvents also can be used. Isolated aluminum salt can be redissolved in water to form a homogenous solution. Additional nitrate optionally can be added to the solution to adjust the nitrate-to-aluminum ratio. Additional nitrate typically is added to obtain a substantially continuous film, a substantially smooth film, or a substantially continuous smooth film, when coating precursor solution is used to form a thin film.

Disclosed compositions are useful, amongst other things, for forming electronic devices. These embodiments typically involve forming a thin film of $Al_2O_3$ on a substrate by depositing disclosed precursor coating compositions onto the substrate. The coated substrate is heated to remove polyatomic ligands and at least a portion of the water. The substrate also is heated to temperatures within a temperature range of between about 100° C. and about 900° C. to further eliminate water and polyatomic ligands and to form and densify a thin film of $Al_2O_3$ on the substrate. The precursor coating composition may be applied to the substrate by any suitable process, such as spin coating, spray coating, dip coating, knife edge coating, or aerosol chemical vapor deposition. The layer of precursor coating material generally has an average thickness from about 0.5 nm to about 750 nm.

A particular embodiment comprises forming a coating on a crystalline silicon solar cell. Disclosed embodiments comprise providing a crystalline silicon substrate having a front side and a back side. Disclosed embodiments of a precursor solution are deposited on the front side of the crystalline silicon substrate, on the back side of the crystalline substrate, or are deposited on both the front side and the back side. A dielectric aluminum oxide film is formed on at least one side of the substrate, or both, by annealing the coating precursor at a temperature between about 80° C. and 900° C., the aluminum oxide film having a thickness of from about 0.5 nm to about 100 nm. The coating may be, for example, a passivation coating or an optical coating. The dielectric coating film limits electron-hole recombination rates in silicon, and may function as an internal-reflection coating film. The dielectric aluminum oxide film typically has a refractive index between about 1.45 and about 1.65.

Another embodiment of a disclosed method for forming an electronic device comprises depositing disclosed coating precursor solution onto a substrate. The substrate and precursor solution are heated to form a dielectric aluminum oxide film at temperatures between 80° C. and 900° C., the aluminum oxide film having a thickness of from about 0.5 nm to 2,000 nm. Exemplary devices that can be made by the method include a field effect transistor or a capacitor. Certain disclosed dielectric films have typical breakdown strengths of greater than 1.0 MV/cm, and dielectric constants of at least 5.

BRIEF DESCRIPTION OF THE DRAWINGS

FIGS. 8A-8C are high resolution transmission electron microscopy (HRTEM) images of aluminum oxide thin films prepared (a) with no anneal; (b) annealed at 500° C. for 1 hour; and (c) magnification of selected area in (b).

DESCRIPTION

Figure 1:
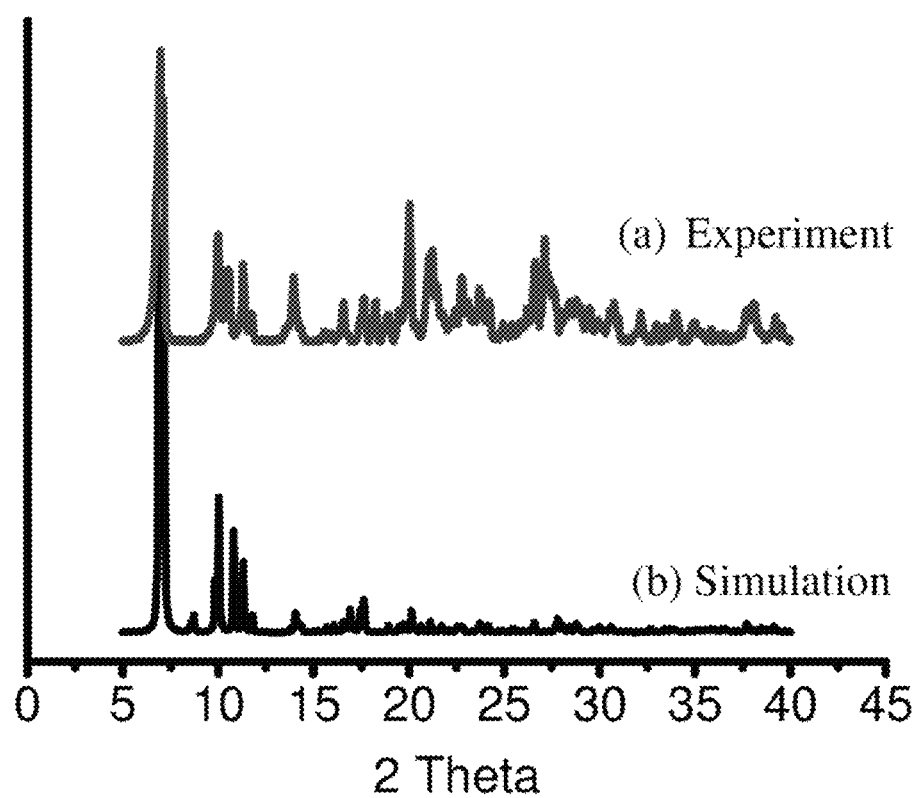
FIG. 1 provides powder X-ray diffraction patterns of: (a) poly-crystalline powder from experiment after IPA wash; and (b) simulation from $[Al_{13}(OH)_{24}(H_2O)_{24}](NO_3)_{15}$ single crystal.

Conventional approaches for the formation of aluminum oxide thin films include, for example, chemical vapor deposition and physical vapor deposition. These processes are generally performed under high vacuum. While these vacuum approaches can form solid films of aluminum oxide, the high vacuum approaches have high capital costs, high energy consumption, significant process complexity, inefficient material usage and low throughput. Furthermore, it is difficult to form large area films with vacuum approaches with a high degree of uniformity.

Solution based synthesis processes have been discovered that can form high quality aluminum oxide films using an aqueous solution based process that can avoid compositions that introduce contaminants and that avoid particularly hazardous compounds. The precursor solutions can comprise an aluminum cation and a highly controlled nitrate composition. The precursor solutions are suitable for depositing or printing to produce a precursor layer that can be processed to form an aluminum oxide film. Due to the design of precursor solutions free from halogen atoms and carbon-carbon bonds, the precursors can be processed into high quality aluminum oxide films with significantly higher density, lower contaminant levels, and smoother surfaces compared with other solution based processes. The precursors can be converted to desired films using a thermal process at moderate temperatures. The improved precursor solutions can be processed into quality aluminum oxide films with a desirable high level of purity and with a high level of uniformity as well as ready commercial adaptability. The precursor solutions generally comprise an aqueous solvent which further provides handling and environmental benefits.

The high surface tension of the aqueous solvent promotes smooth film surfaces, allowing for the first time the ability to deposit by solution methods aluminum oxide films in the thickness range of 1 nm to 10 nm with a surface roughness<0.5 nm. These features are useful in the fabrication of a variety of optical and electronics devices. These properties as well as their implementation in capacitor and thin-film device structures are described below.

WORKING EXAMPLES

The following examples are provided to exemplify certain features of working embodiments. A person of ordinary skill in the art will appreciate that the scope of the present invention is not limited to the features of these working embodiments.

I. Precursor Preparation.

$Al(NO_3)_3 \cdot 9H_2O$ powder was dissolved in water to make a 1.6 M $Al^{3+}$(aq) solution. Zinc power was then added to the solution to obtain a total metal concentration of 2.4 M (Zn:Al=1:2). The solution was stirred mildly with a magnetic stir bar under atmospheric conditions. While stifling, the zinc powder was consumed, generating colorless and brown-red gases and an increase of solution temperature (~40° C. to 50° C.). A clear solution was obtained after stifling for about 5 hours. The solution was kept in an uncovered crystallizing dish in the fume hood for evaporation (~30 ml in 3 day). A polycrystalline powder will subsequently be isolated. The polycrystalline powder was washed four times with isopropyl alcohol to remove $Zn(NO_3)_2$. Because of solubility differences, the target product $[Al_{13}(OH)_{24}(H_2O)_{24}](NO_3)_{15}$ can be separated from other reaction products, e.g., $Zn(NO_3)_2$ and excess $Al(NO_3)_3$. The resultant powder was kept in ambient environment for 5 hours until a dry white $[Al_{13}(OH)_{24}(H_2O)_{24}](NO_3)_{15} \cdot nH_2O$ powder was obtained. The hydration number n is determined for each preparation by calculation according to the mass of aluminum oxide resulting from calcination of $[Al_{13}(OH)_{24}(H_2O)_{24}](NO_3)_{15} \cdot nH_2O$ powder at 800° C. for 10 hours. The solution precursor for thin-film fabrication was obtained by co-dissolution of $[Al_{13}(OH)_{24}(H_2O)_{24}](NO_3)_{15} \cdot nH_2O$ and $Al(NO_3)_3 \cdot 9H_2O$ at ratios ranging from 1:3 to 2:3, respectively. The solution was deposited on carefully cleaned substrates with hydrophilic surfaces and rotating at 3000 rpm for 30 seconds, followed by a hot-plate curing at 275° C.-400° C. for 1 minute. The process was repeated until the desired thickness was obtained. A post anneal process at 300-800° C. in air for 30 to 60 minutes was executed for further dehydration and densification.

A. Balanced Chemical Reactions for Zn Dissolution.

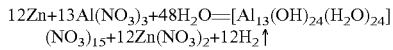

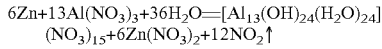

According to these equations, the colorless gas generated during the reaction is $H_2$, while the brown-red gas generation is $NO_2$.

II. Phase Identification

Figure 2:
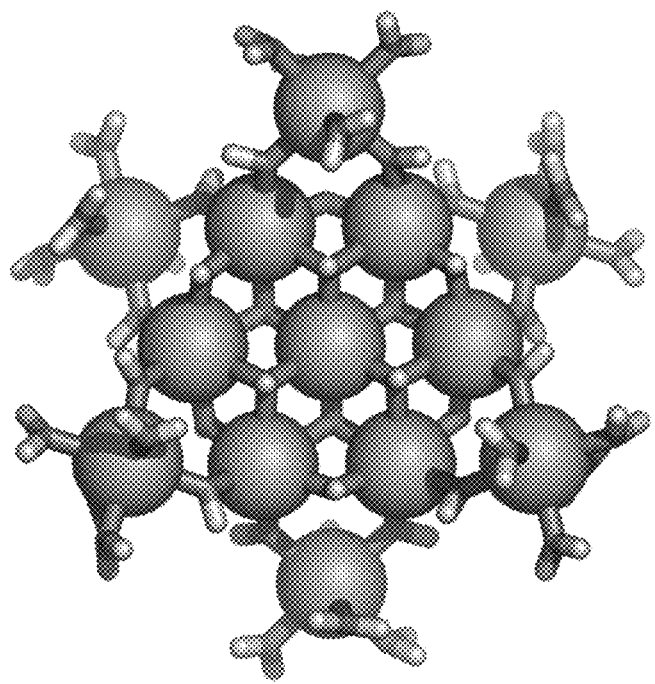
FIG. 2 is a schematic representation of the "flat" $Al_{13}$ polynuclear cluster in $[Al_{13}(OH)_{24}(H_2O)_{24}](NO_3)_{15}$, where the large spheres represent Al atoms.

The polycrystalline powder precursor was identified as $[Al_{13}(OH)_{24}(H_2O)_{24}](NO_3)_{15}$ from powder X-ray diffraction measurements (FIG. 1.) The experiment was carried out by using Cu Kα radiation at a low scanning step size of 0.02 degree per second. The isolated salt contains the "flat" polynuclear $Al_{13}$ cluster shown in FIG. 2.

III. Thin-Film Optical Properties and Density

Figure 3:
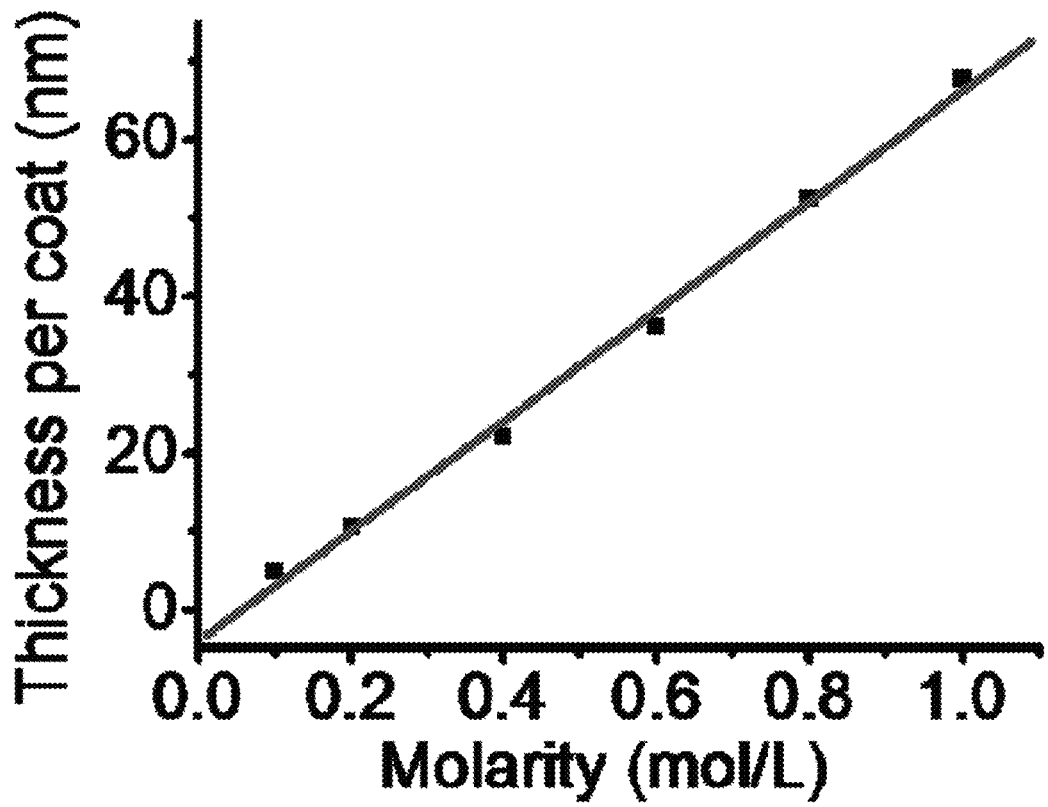
FIG. 3 is a graph of thickness (Y-axis; nanometers) as a function of concentration (X-axis; molarity) illustrating the relationship between derived film thickness and precursor concentration.
Figure 4:
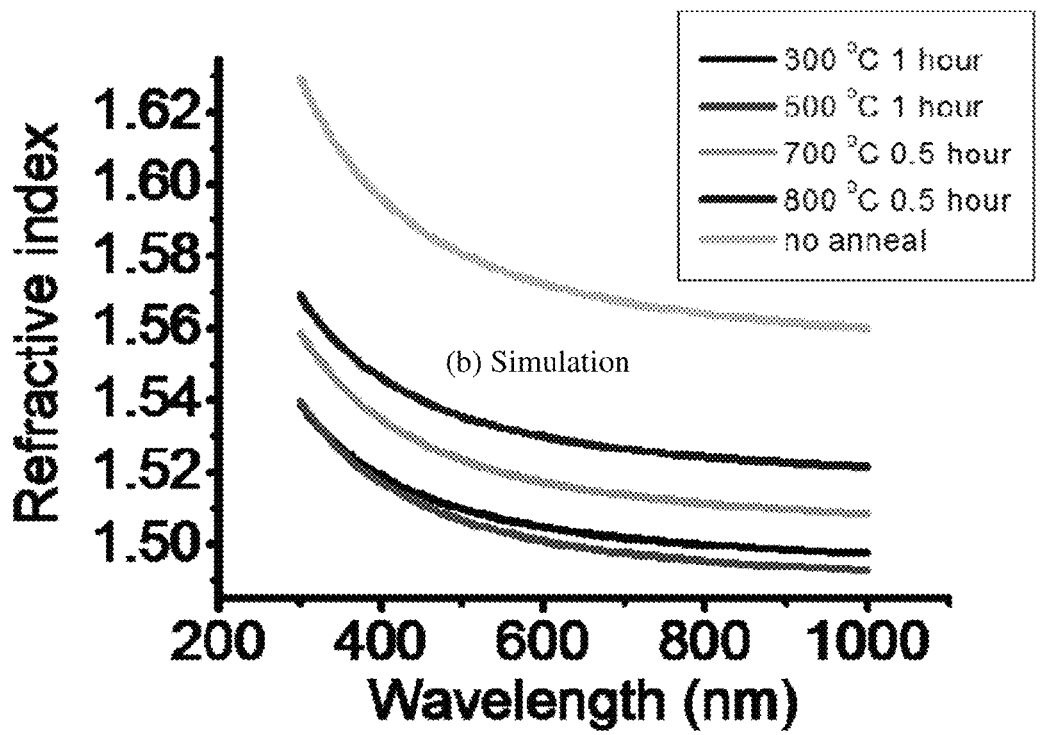
FIG. 4 provides dispersion curves [refractive index (Y-axis) versus wavelength (X-axis; nanometers)] for samples annealed at selected temperatures and annealing timers illustrating that the refractive index of the films changes with post annealing conditions, which results in different levels of dehydration and densification.
Figure 5:
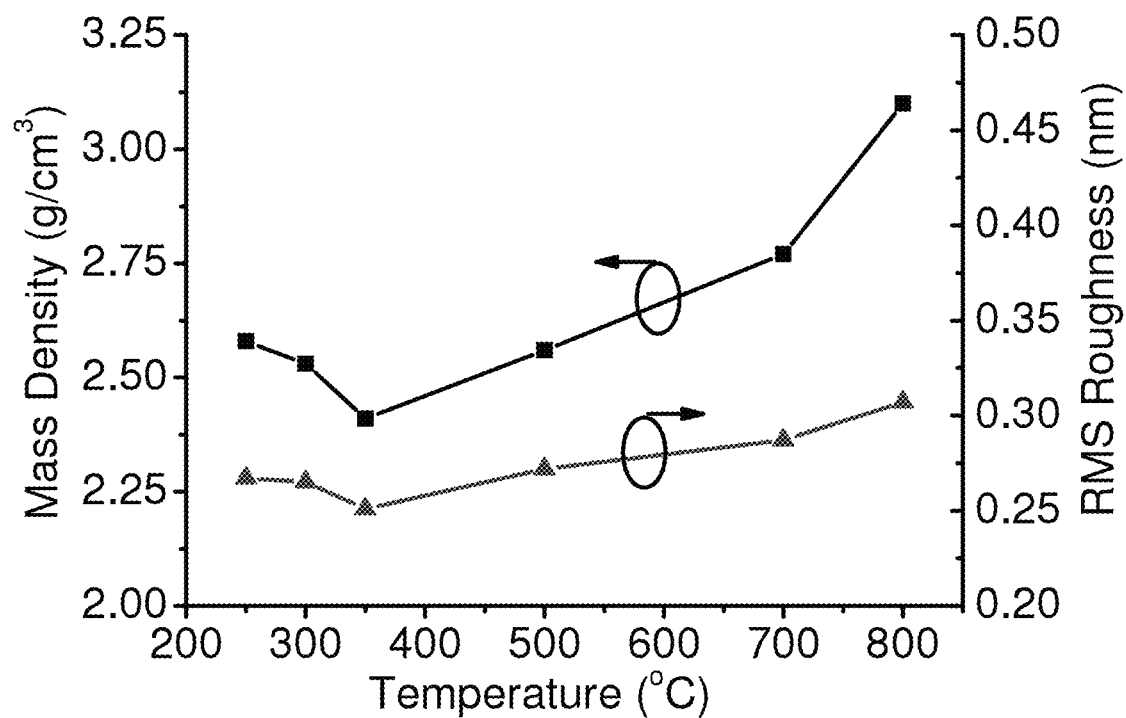
FIG. 5 provides mass density (left Y-axis: g/cm$^3$) and surface roughness (right Y-axis; nm) as a function of temperature (X-axis; °C.) illustrating densification and surface characteristic of solution-derived $Al_2O_3$ film. Results were derived from X-ray reflectivity measurements.
Figure 6B:
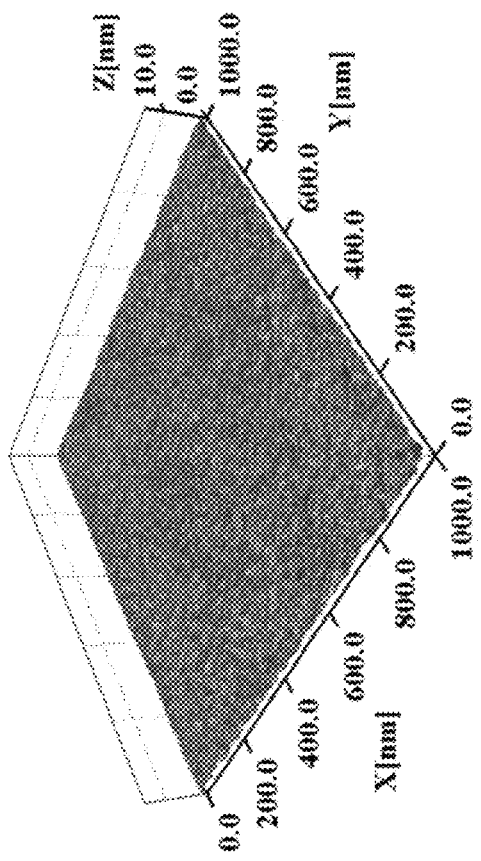
FIGS. 6A-6E are contact mode atomic force microscope (AFM) images of aluminum oxide thin films under different anneal conditions that were obtained by scanning over a 1-μm$^2$ area, where the conditions were (a) no anneal, rms roughness 0.26 nm; (b) 300° C. 1 hour, rms roughness 0.22 nm; (c) 500° C. 1 hour, rms roughness 0.19 nm; (d) 700° C. 0.5 hour, rms roughness 0.214 nm; and (e) 800° C. 0.5 hour, rms roughness 0.26 nm.
Figure 6A:
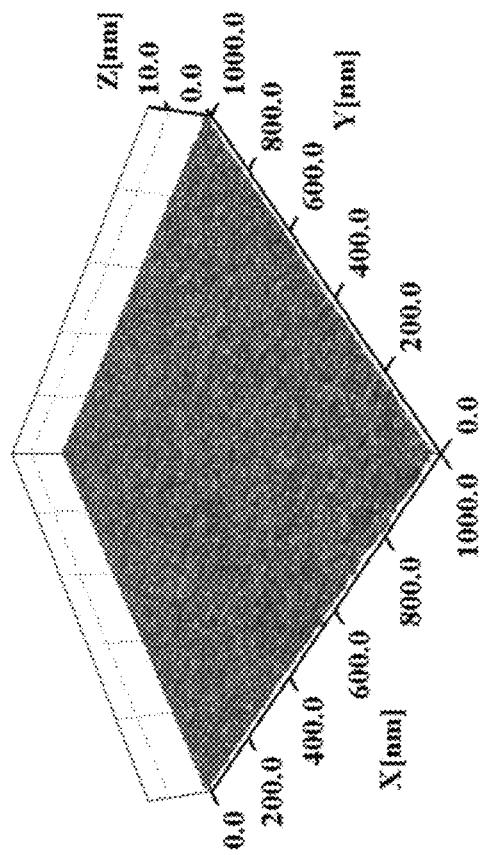
Figure 6D:
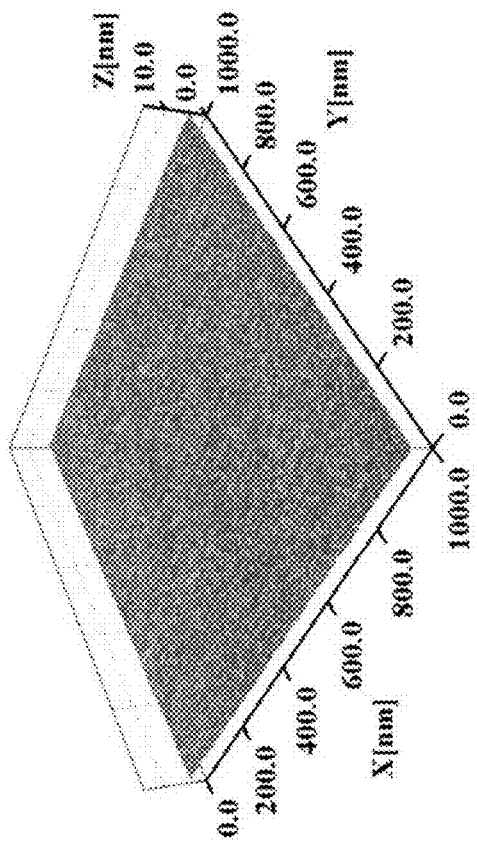
Figure 6C:
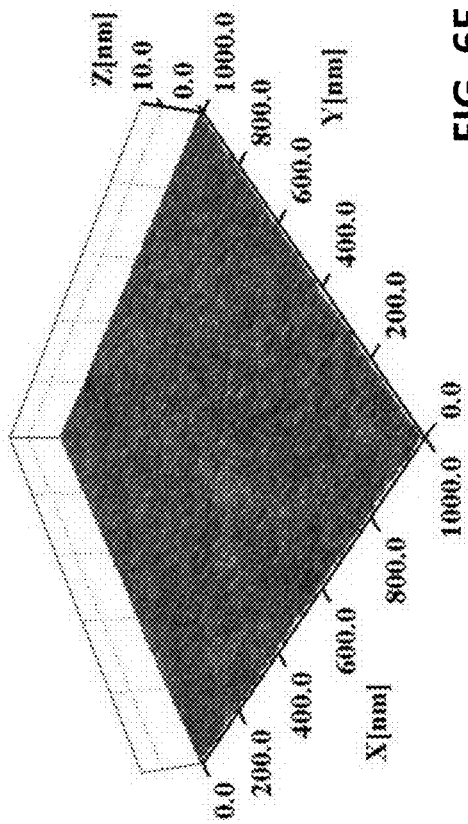
Figure 6E:
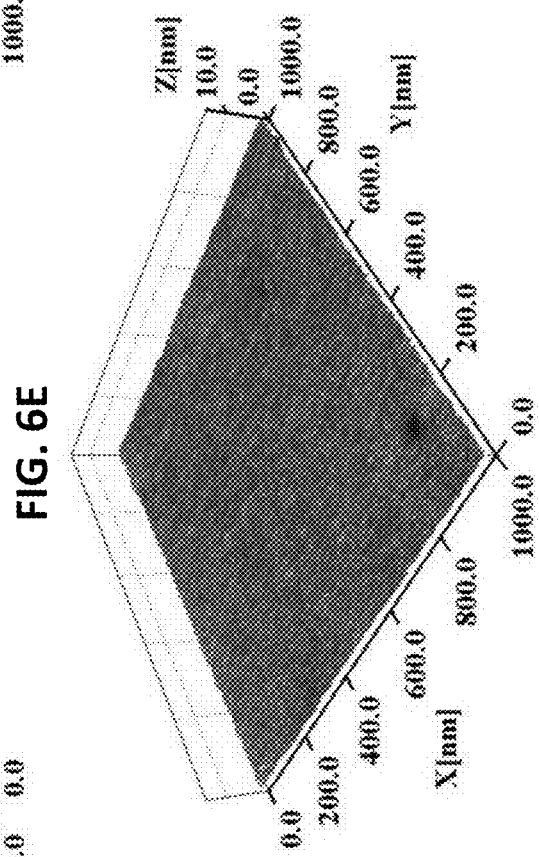

The solution precursor was deposited onto Si wafers and heated at selected temperatures for characterization of indexes of refraction and density. Spectroscopic ellipsometry data were collected for each thin-film sample at three incident angles (65°, 70°, and 75°) over the wavelength range 300 nm to 1000 nm. Thickness and refractive index were obtained by fitting the spectra using a Cauchy model. The relationship between derived film thickness and precursor concentration is graphically presented in FIG. 3. As shown in FIG. 4, the refractive index of the films changed with post annealing conditions, which results in different levels of dehydration and densification. Density data are summarized in FIG. 5. At low annealing temperatures (<500° C.), dehydration is the dominate factor as only modest densification occurs. On annealing the as-deposited films, air-filled voids form commensurate with dehydration, which likely contributes to the initial reduction in refractive index. When the annealing temperature is higher than 500° C., densification dominates, and a reduction in the number of voids leads to an increase of the refractive index.

IV. Thin Film Surface Morphology

Contact mode Atomic Force Microscope (AFM) images (FIGS. 6A-6E) of aluminum oxide thin films under different anneal conditions were obtained by scanning over a 1-μm² area. The root mean square (rms) roughness of the films is below 0.3 nm following anneals in air up to 700° C. for 30 minutes. After annealing at 800° C. for 30 minutes, defects become detectable on the surface; these small defects are likely associated with the formation of grain boundaries during crystal growth.

Figure 7A:
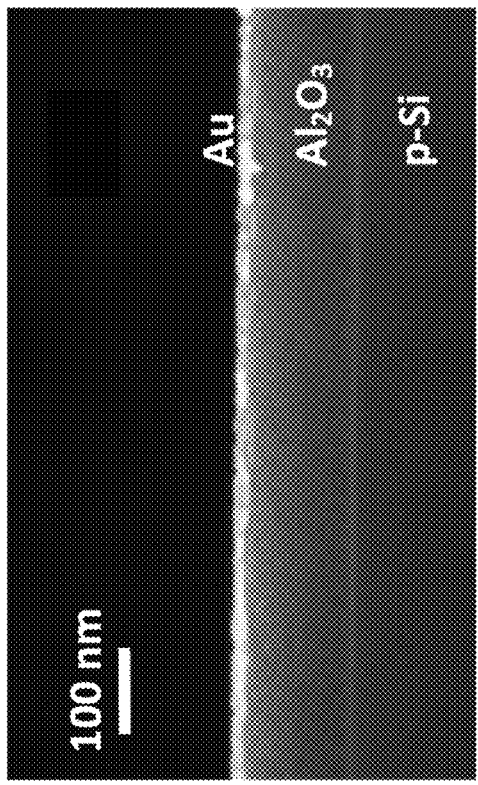
FIGS. 7A-7C are cross-sectional images of aluminum oxide thin films taken with a Zeiss high-resolution SEM by using a 5 KV electron source at different annealing conditions, where (a) was produced with no anneal; (b) was annealed at 500° C. 1 hour; and (c) was annealed at 800° C. 0.5 hour.
Figure 7B:
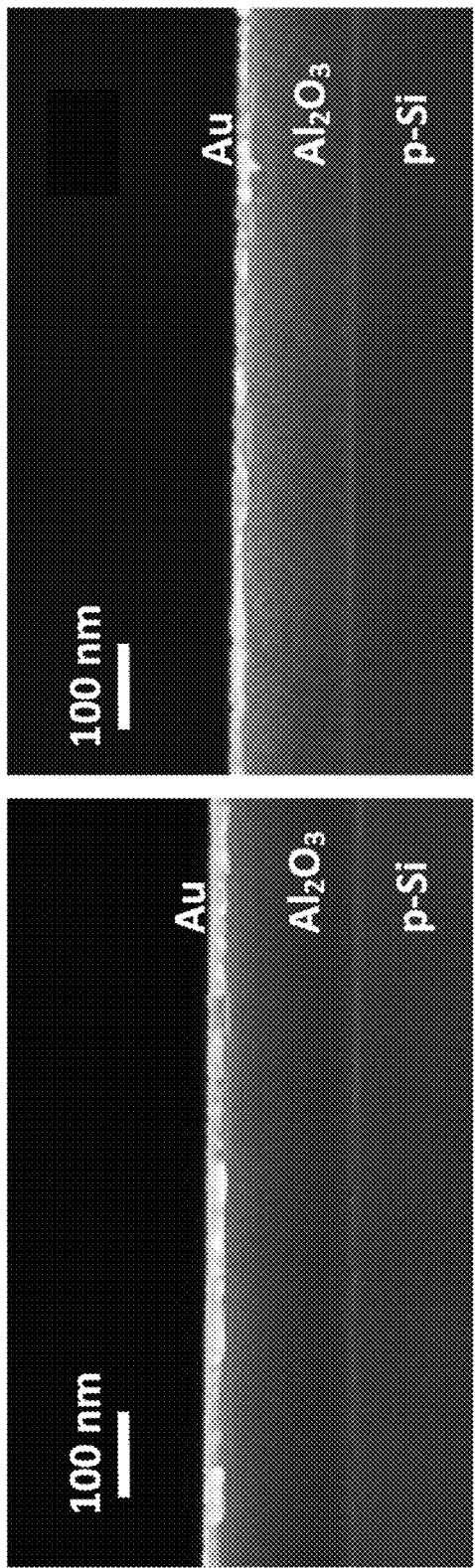
Figure 7C:
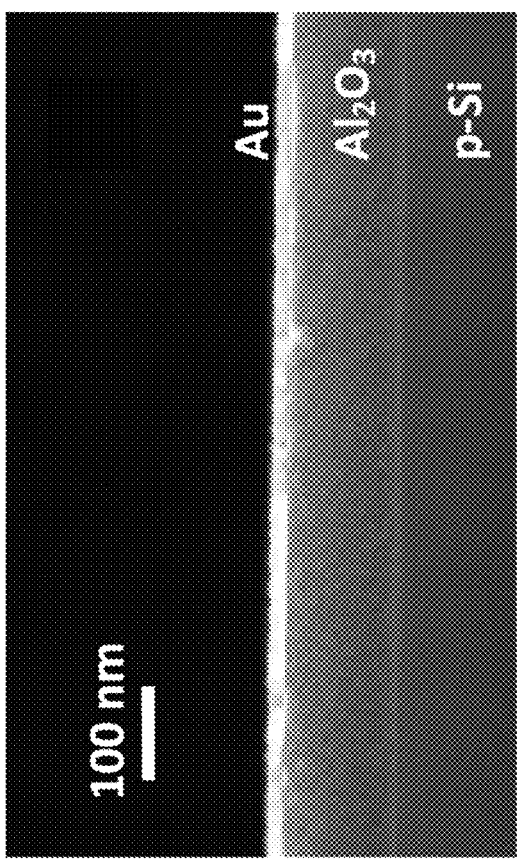

Cross-sectional images (FIGS. 7A-7C) of aluminum oxide films were taken with a Zeiss high-resolution SEM by using a 5-kV electron source. A 20-nm gold coating was thermally evaporated onto the sample surface to reduce charging during the tests. All of the samples exhibit a dense, smooth morphology. Moreover, a significant volume loss due to dehydration can also be observed from the images. Annealing the film at 500° C. for 1 hour generated homogeneous, small aggregates, which grew into a larger size at 800° C.

FIGS. 8A-8C are HRTEM images of aluminum oxide thin films with no anneal; (b) HRTEM of aluminum oxide thin film annealed at 500° C. for 1 hour; (c) and magnification of selected area in (b). The aluminum oxide thin film crystallizes and forms grains approximately 5 nm in diameter after hot-plate curing at 275° C. for 1 minute. A post anneal at 500° C. for 1 hour resulted in an increasing grain size which is larger than 10 nm. FIG. 8(C) is a magnified area of FIG. 8(B), which exhibits the packing of cubic close packed oxygen atoms of a (110) face.

V. MIS Device Fabrication and Characterization

Metal-insulator-semiconductor (MIS) devices were fabricated by thermally evaporating 0.011 cm² aluminum-metal dots via a shadow mask onto a 120-nm thick aluminum oxide thin film on a p-type Si substrate. A Hewlett-Packard 4192A impedance analyzer was used to determine the relative dielectric constant and loss tangent in the frequency range 100 Hz to 1 MHz. Leakage current and breakdown fields were measured with a Hewlett-Packard 4140B picoammeter with a voltage step rate of 1 V/sec. Results are summarized in Table 1. The relative dielectric constant varies from 5.3 to 6.3 because of different levels of dehydration. The leakage current densities of all the devices at an electric field of 1 MV/cm were lower than 10 nA/cm². The breakdown field increases from 4.39 to 6.02 MV/cm with increasing annealing temperature.

TABLE 1

| Sample annealing condition | Dielectric Constant @ 1 kHz | Corrected Dielectric Constant* @ 1 kHz | Loss Tangent @ 1 kHz (%) | Average breakdown field (MV/cm) | Current density @ 1 MV/cm (nA/cm²) |
|---|---|---|---|---|---|
| 300° C. 1 hour | 5.64 | 6.01 | 2.40 | 4.39 | 7.73 |
| 500° C. 1 hour | 5.31 | 5.68 | 0.51 | 5.10 | 0.94 |
| 700° C. 30 min | 6.34 | 7.17 | 0.33 | 6.02 | 0.40 |
| SiO₂ 100 nm | 3.91 | NA | 0.02 | 8.88 | 0.16 |

Dielectric properties obtained from MIS devices containing 110 to 130 nm aluminum oxide thin films under different annealing conditions.
(*Corrected dielectric constant is calculated according to the thickness of native oxide on p-type Si under different annealing conditions)

Figure 9:
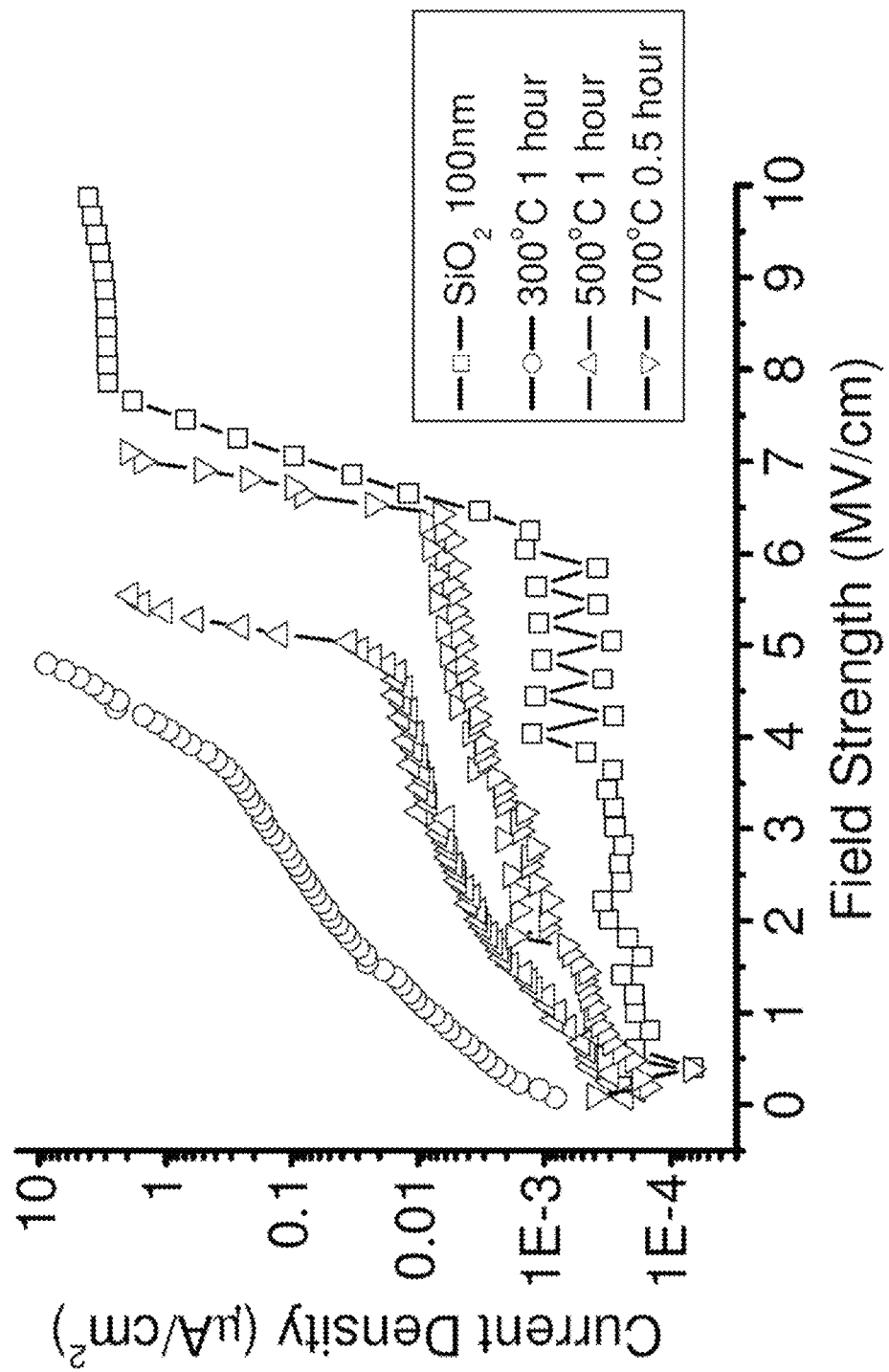
FIG. 9 provides breakdown curves [(Y-axis=current density; μA/cm$^2$); (X-axis=field strength; MV/cm)] of MIM devices containing 110 to 130-nm aluminum oxide thin films under different annealing conditions with data for 100-nm $SiO_2$ control device.

FIG. 9 indicates the breakdown curve of the MIS devices. After 300° C. annealing for 1 hour, the dielectric layer behaves largely like a resistor with a constant slope over the testing electric field range. When the annealing temperature reaches 500° C., the dielectrics start to show catastrophic breakdown at about 5 MV/cm. Further increase of the annealing temperature to 700° C. results in a higher breakdown field and a lower leakage current at the same electrical field, approaching the characteristics of a thermally grown $SiO_2$ dielectric.

VI. Thin Film Transistor (TFT)

Figure 10:
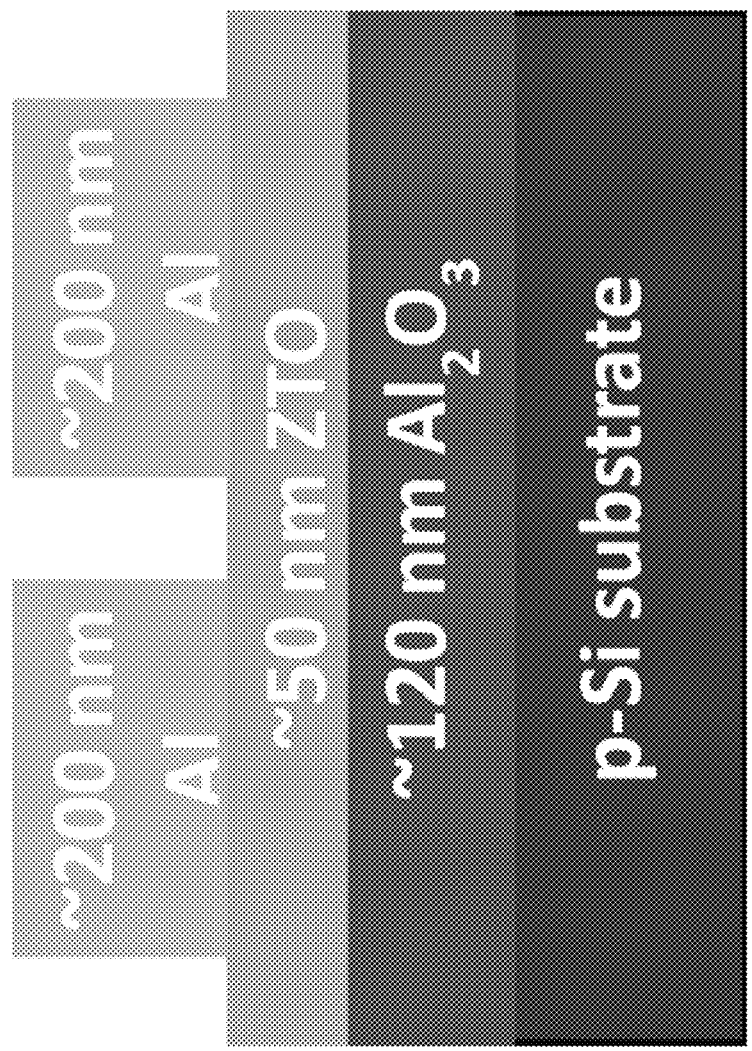
FIG. 10 is schematic of an exemplary aluminum oxide/ZTO thin-film transistor structure.

TFTs were fabricated according to the stack structure shown in FIG. 10. A 120-nm aluminum oxide layer was deposited by spin-coating the precursor described herein onto a p-type silicon substrate as a gate dielectric followed by 500° C. annealing for 1 hour. A 50-nm zinc tin oxide channel layer was sputter-deposited onto the dielectric thin film through a shadow mask. The stack was annealed at 500° C. for an hour. Aluminum source and drain contacts were thermally evaporated onto the channel area also through a shadow mask. The ratio of channel width-to-length for the device is 10. Control devices containing 100-nm $SiO_2$ as a dielectric layer were also fabricated.

Figure 11B:
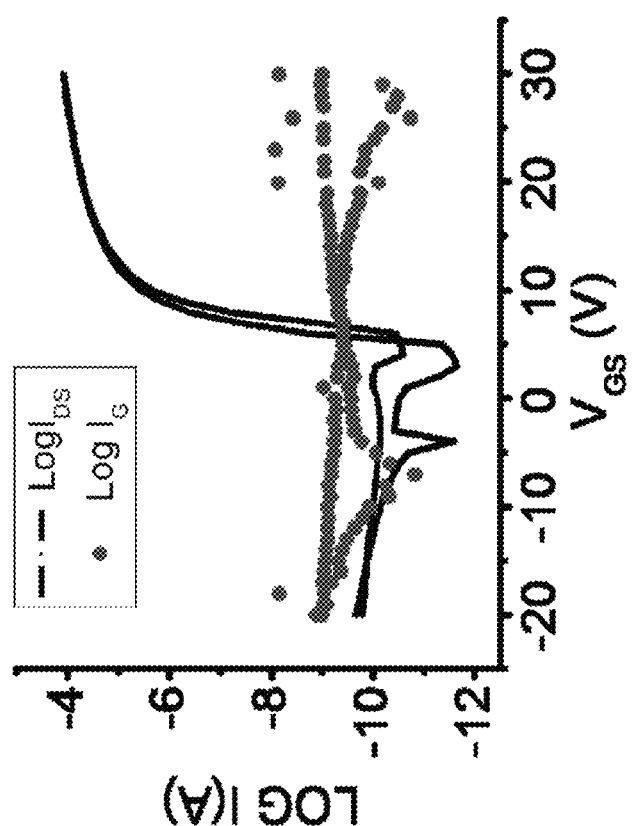
FIG. 11B is a transfer curve of a 100 nm $SiO_2$/ZTO control devices.
Figure 11A:
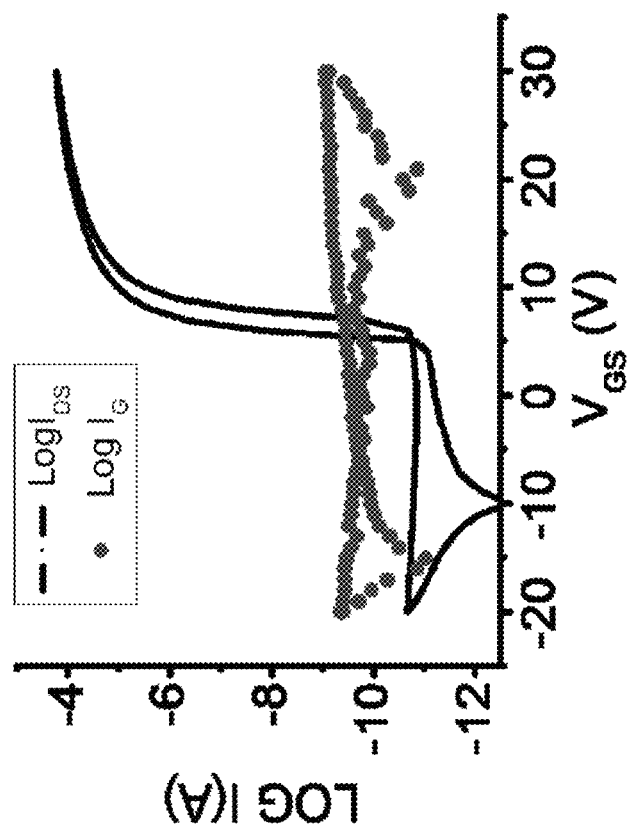
FIG. 11A is a transfer curve of 120 nm aluminum oxide/ZTO TFT.
Figure 12B:
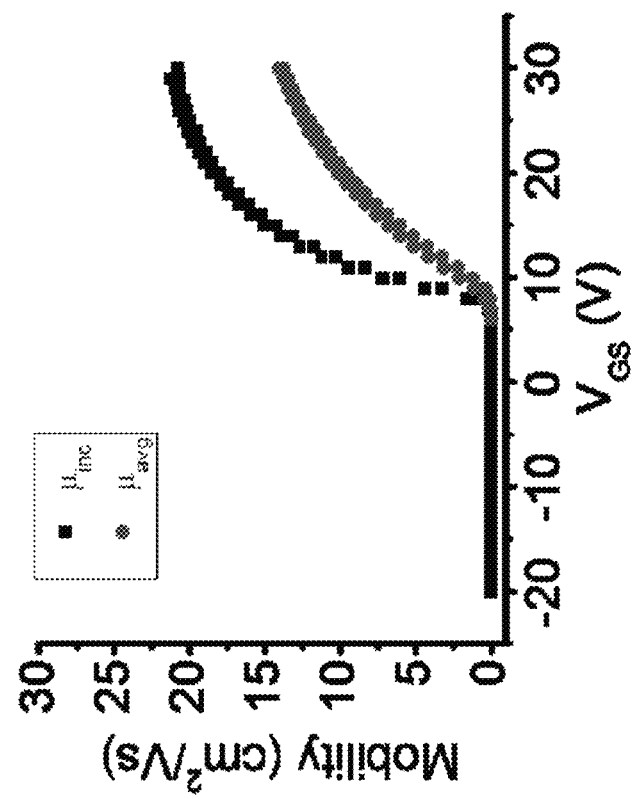
FIG. 12B is a mobility-voltage curve of a 100 nm $SiO_2$/ZTO control device.
Figure 12A:
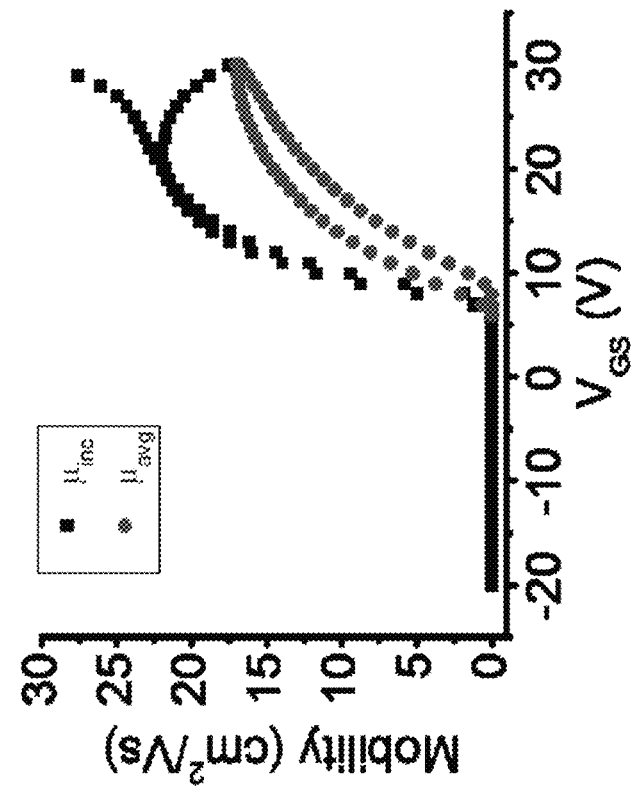
FIG. 12A is a mobility-voltage curve of 120 nm aluminum oxide/ZTO TFT.

The TFT fabricated with aluminum oxide as the gate dielectric from the aqueous precursor exhibited an on/off current ratio, turn-on voltage, and hysteresis comparable to those of the $SiO_2$-dielectric TFT control (FIGS. 11A and 11B). Most importantly, the gate leakage current is approximately $10^{-9}$ A and constant over the entire sweep from −20 V to +30 V. From FIGS. 11A and 11B, the mobility of each device is comparable, reaching 25 $cm^2$/Vs for a gate voltage of 30 V.

VII. Surface Passivation for Crystalline Silicon (c-Si) Solar Cells

The carrier recombination lifetime is the central parameter for designing and producing highly efficient silicon solar cells. The efficiency of a solar cell is proportional to the carrier lifetime in the photoexcited state, i.e., long lifetimes lead to high efficiency. For lifetimes greater than the transit time through the wafer, photogenerated current collection can be high. With long lifetimes, current extraction can be maintained at high voltages, producing commercially important power levels.

Figure 13:
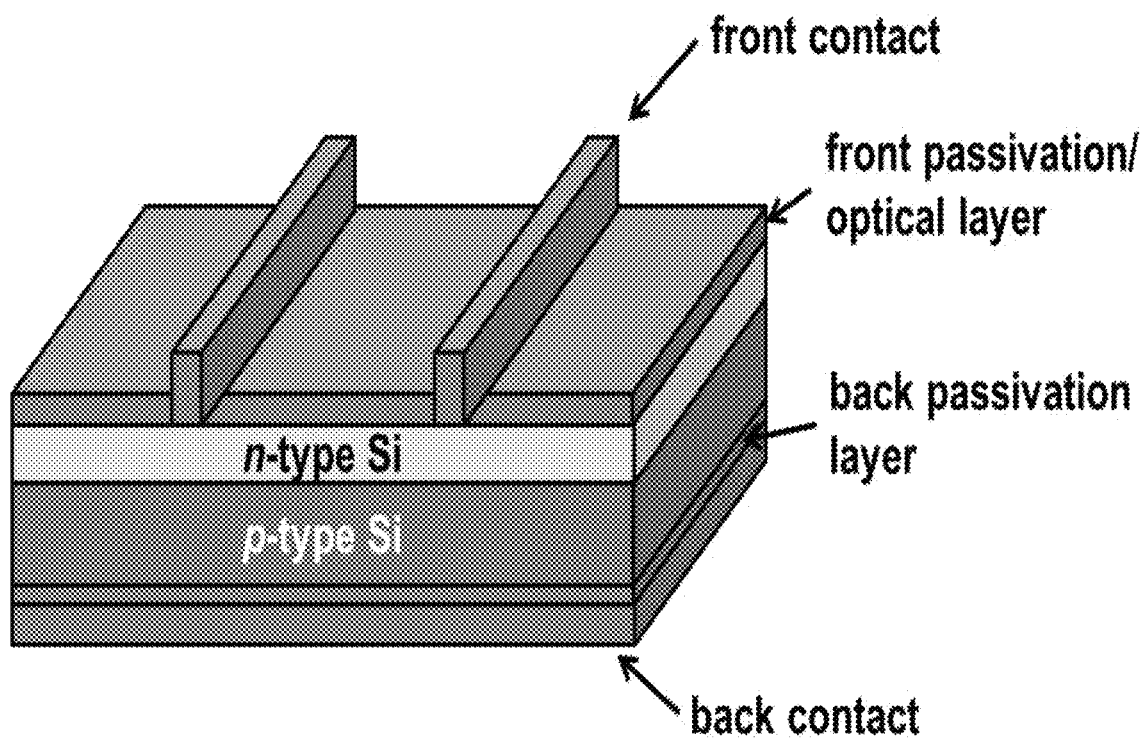
FIG. 13 is a schematic of an exemplary crystalline silicon (c-Si) solar cell.

Cost drivers in c-Si fabrication are forcing manufacturers to use smaller quantities of Si and thinner wafers. As a result, surface-to-volume ratios of the wafers are increasing, magnifying the effects of surface recombination on carrier lifetimes. Surface recombination at an untreated Si wafer surface is much faster than in the bulk, resulting in an intrinsic loss of efficiency for a thin c-Si solar cell. The surface recombination lifetime can be lengthened and the cell efficiency improved by coating the Si wafer with a thin passivation layer. A schematic of an exemplary c-Si solar cell is shown in FIG. 13.

Thin film hydrogenated amorphous silicon nitride (a-$SiN_x$:H) is commonly applied to the front side of Si solar cells as an antireflection coating. These films also play a passivation role by inhibiting surface recombination in low-resistivity n- and p-type Si. The surface passivation with a-$SiN_x$:H on highly doped p-type silicon, however, is rather poor. When a-$SiN_x$:H is applied on the back side of a p-type solar cell the high positive built-in charge induces a parasitic junction, limiting the solar cell efficiency.

Thermally grown $SiO_2$ films provide state-of-the-art passivation for both n- and p-type Si at various dopant levels. The surface passivation of the as-grown thermal oxide is modest, but it is significantly improved by a subsequent annealing in an $H_2(g)/N_2(g)$ atmosphere. The best results are obtained by the alneal process, where a sacrificial layer of Al is evaporated on the film prior to annealing. On annealing, the Al film releases atomic hydrogen, which strongly reduces the number of interface defect states. These processes require high temperatures (950° C.-1000° C.) and elaborate processing, which are generally not desirable.

The dielectric $Al_2O_3$ has also been shown to be an effective surface passivation layer and to improve the optical quality at the front and back sides of c-Si solar cells. Such films have been produced by pyrolysis of aluminum-tri-isopropoxide and atomic layer deposition (ALD). The ALD approach with $Al_2O_3$ provides an attractive option with respect to processing at temperatures much lower than those associated with thermal formation of $SiO_2$. It is, however, a slow process, requiring costly equipment and precursors.

The manufacture of c-Si solar cells would greatly benefit from the availability of a method to form $Al_2O_3$ passivation and optical films in air that makes use of solution processing and a conventional wafer-track manufacturing system. The key limiting aspect in realizing such a method arises from the unavailability of appropriate solution-based precursors that can readily be transformed into high-quality $Al_2O_3$ films. Ideally, such precursors would be based on water chemistries, enabling environmentally benign, sustainable, and low-cost use.

VIII. Aqueous Precursor for High-Quality Film

The salt $[Al_{13}(\mu_3\text{-}OH)_6(\mu\text{-}OH)_{18}(H_2O)_{24}][NO_3]_{15}$ represents an ideal precursor for deposition of an $Al_2O_3$ film. It contains a polycationic hydroxo aluminum core that can be efficiently transformed to $Al_2O_3$ with minimal volume change through loss of water and decomposition of nitrate. The preparation of such a complex salt in water, however, has not been previously addressed. As a polynuclear hydroxo complex, it should be produced upon increasing the pH of a simple solution of aqueous aluminum nitrate —$Al(NO_3)_3$ (aq). This change in pH is most commonly effected by titrating an $Al(NO_3)$(aq) solution with an aqueous base such as NaOH(aq) or $NH_3$(aq). Such titration, however, produces the so-called Keggin species $[Al_{12}(AlO_4)(OH)_{24}(H_2O)_{12}]^{7+}$. This species is of little use as a precursor, since it co-precipitates with the ancillary cations present in the titration process. It also has a very limited solubility in water.

The formation of the Keggin ion is associated with the high pH spike that occurs on addition of a drop of base to an acidic solution of $Al(NO_3)_3$(aq). This pH spike can be eliminated by using an active metal, e.g., Zn, to control the reduction rate of $HNO_3$(aq) in the $Al(NO_3)_3$(aq) solution, thereby smoothly and gradually raising the pH to effect the formation of the desired polynuclear aluminum salt $[Al_{13}(\mu_3\text{-}OH)_6(\mu\text{-}OH)_{18}(H_2O)_{24}][NO_3]_{15}$. The metal reductant should not be overly active with respect to the rate of reduction, as pH spikes and high gradients can occur. In addition, the oxided product of the metal reductant must be readily separated to allow isolation of the desired salt in high yield. Preferred metal reductants are Zn, Al, Fe, and Cu. Because the polynuclear salt is hydrolytically stable and highly soluble in water, it possesses useful characteristics as a precursor for the production of high-quality $Al_2O_3$ films.

The present invention has been described with reference to features useful for exemplifying the invention. A person of ordinary skill in the art will realize that the scope of the invention is not limited to these features.

We claim:

1. A method for forming a thin film of $Al_2O_3$ on a substrate, the method comprising:
    forming a layer of precursor coating material comprising water, $Al_{13}(OH)_{24}(H_2O)_{24}](NO_3)_{15}$, or a combination of $Al_{13}(OH)_{24}(H_2O)_{24}](NO_3)_{15}$ and $Al(NO_3)_3$, on a substrate, thereby forming a coated substrate;
    heating the coated substrate to remove ligands and at least a portion of the water; and
    heating the coated substrate at a temperature within a temperature range of between about 100° C. and about 900° C. to eliminate water and to form and densify a thin film of $Al_2O_3$ having a thickness of 0.5 nm to 2,000 nm on the substrate.

2. The method of claim 1 wherein the precursor coating material comprises a molar concentration ratio of ligands to Al cations of less than 3.

3. The method of claim 1 wherein forming a layer of precursor coating material comprises spin coating, spray coating, dip coating, knife edge coating, or aerosol chemical vapor deposition.

4. The method of claim 1 wherein the layer of precursor coating material has an average thickness from about 0.5 nm to about 750 nm.

5. A method of forming a coating on a crystalline silicon solar cell, comprising:
    providing a crystalline silicon substrate having a front side and a back side;
    depositing a coating precursor solution comprising a mixture of water, $Al_{13}(OH)_{24}(H_2O)_{24}](NO_3)_{15}$, or a combination of $Al_{13}(OH)_{24}(H_2O)_{24}](NO_3)_{15}$ and $Al(NO_3)_3$, on the front side of the crystalline silicon substrate, on the back side of the crystalline substrate, or on both the front side and the back side; and forming a dielectric aluminum oxide film on at least one of the front and the back side by annealing the coating precursor at a temperature within a temperature range of from 80° C. to 900° C., the aluminum oxide film having a thickness of from about 0.5 nm to about 100 nm.

6. The method of claim 5 where the coating is a passivation coating.

7. The method of claim 5 where the coating is an optical coating.

8. The method of claim 5 wherein the precursor solution has an aluminum cation concentration from about 0.01 M to about 3.5 M.

9. The method of claim 5 wherein the precursor solution has a polyatomic anion concentration from about 0.1 to about 2.5 times an aluminum cation concentration.

10. The method of claim 5 wherein depositing the coating precursor solution comprises spin coating, spray coating, dip coating, knife edge coating, or aerosol chemical vapor deposition.

11. The method of claim 5, wherein the dielectric aluminum oxide film limits electron-hole recombination rates in silicon.

12. The method of claim 5, wherein the dielectric aluminum oxide film has a refractive index between 1.45 and 1.65.

13. The method of claim 5, wherein the dielectric aluminum oxide film functions as an anti-reflection coating.

14. The method of claim 5, wherein the dielectric aluminum oxide film functions as an internal-reflection coating.

15. A method for forming an electronic device comprising an $Al_2O_3$ dielectric film, wherein the dielectric film is manufactured by a method comprising:

depositing a coating precursor solution comprising a mixture of water, $Al_{13}(OH)_{24}(H_2O)_{24}](NO_3)_{15}$, or a combination of $Al_{13}(OH)_{24}(H_2O)_{24}](NO_3)_{15}$ and $Al(NO_3)_3$, onto a substrate, thereby forming a coated substrate; and forming a dielectric aluminum oxide film by heating the coated substrate at a temperature within a temperature range of from 80° C. to 900° C., the aluminum oxide film having a thickness of from about 0.5 nm to 2,000 nm.

16. The method of claim 15 wherein the precursor solution has an aluminum cation concentration from about 0.01 M to about 3.5 M.

17. The method of claim 15 wherein the precursor solution has a polyatomic anion concentration from about 0.1 to about 2.5 times an aluminum cation concentration.

18. The method of claim 15 wherein depositing a coating precursor solution comprises spin coating, spray coating, dip coating, knife edge coating, or aerosol chemical vapor deposition.

19. The method of claim 15 wherein the device includes a field effect transistor or a capacitor.

20. The method of claim 15, wherein the dielectric aluminum oxide film has a breakdown strength of greater than 1.0 MV/cm.

21. The method of claim 15 wherein the dielectric aluminum oxide film has a relative dielectric constant of at least 5.

* * * * *